United States Patent [19]

Tai

[11] Patent Number: 5,521,124
[45] Date of Patent: May 28, 1996

[54] METHOD OF FABRICATING PLASTIC TRANSFER MOLDED SEMICONDUCTOR SILICONE BRIDGE RECTIFIERS WITH RADIAL TERMINALS

[76] Inventor: Chao-Chi Tai, 14F, No. 133, Sec. 1, Pei Hsin Rd., Hsin Tien City, Taipei Hsien, Taiwan

[21] Appl. No.: 416,358

[22] Filed: Apr. 4, 1995

[51] Int. Cl.$^6$ .................................................. H01L 21/60
[52] U.S. Cl. ........................ 437/209; 437/211; 437/214; 437/217; 437/219
[58] Field of Search ..................... 437/209, 211, 437/212, 213, 214, 215, 216, 217, 218, 219, 220, 208; 257/723, 726, 727, 925, 909

[56] References Cited

U.S. PATENT DOCUMENTS

| | | | |
|---|---|---|---|
| 3,706,129 | 12/1972 | McCann | 437/208 |
| 3,959,676 | 5/1976 | Striker | 437/209 |
| 4,224,663 | 9/1980 | Maiese et al. | 257/727 |
| 4,314,271 | 2/1982 | Heyke et al. | 257/909 |
| 4,672,422 | 6/1987 | Schierz | 257/726 |
| 4,724,474 | 2/1988 | Duchek et al. | 257/909 |
| 4,994,890 | 2/1991 | Caldwell | 257/726 |
| 5,013,948 | 5/1991 | Tumpey et al. | 257/909 |
| 5,218,231 | 6/1993 | Kudo | 257/735 |
| 5,391,919 | 2/1995 | Torti et al. | 257/925 |

FOREIGN PATENT DOCUMENTS

| | | | |
|---|---|---|---|
| 56-83055 | 7/1981 | Japan | 257/925 |
| 62-2558 | 1/1987 | Japan | 257/925 |

Primary Examiner—Tom Thomas
Assistant Examiner—Kevin M. Picardat
Attorney, Agent, or Firm—Morton J. Rosenberg; David I. Klein

[57] ABSTRACT

The method includes the steps of (i). preparing a substrate from a fiber glass reinforced plastic board, then processing the substrate with terminal mounting holes and pre-scared grooves, (ii) fastening lead wire terminals or lead frame terminals to the terminal mounting holes, (iii) fastening diode dice, metal diode disc contacts or small outline axial mounted diodes to the terminals, (iv) molding a plastic molded body on each individual element of the substrate over each set of terminals and diodes, and (v) cutting off the connecting ribs of the terminals, hot dip tinning the terminals, and then separating the substrate through the pre-scaled grooves into individual semiconductor silicone bridge rectifiers for final packing individually.

10 Claims, 11 Drawing Sheets

METHOD OF FABRICATING PLASTIC TRANSFER MOLDED SEMICONDUCTOR SILICONE BRIDGE RECTIFIERS WITH RADIAL TERMINALS

BACKGROUND OF THE INVENTION

Silicone bridge rectifiers of capacity 50 Amperes are commonly made by mounting four rectifying diodes in a heat dissipating device and then sealed electrically through a packing procedure. Nowadays, the annual world demand for silicone bridge rectifiers is about three hundred million pieces. These silicone bridge rectifiers are commonly made by: 1. SIP (SINGLE IN-LINE PACKAGE), 2. WO TYPE PACKAGE, or 3, DIP (DUAL IN-LINE PACKAGE). WO TYPE PACKAGE is developed by GIC (General Instrument Corporation) which arranges the conductors radially so that the conductors and the diodes can be easily and economically welded together. However, the molding tool for molding the body with plastics is difficult to design and to manufacture. GIC and other major silicone bridge rectifiers commonly adopt the casting or the case potting procedure to finish the package. The casting procedure is performed by using RTV open cavity mold, then filling liquid epoxy resin into the mold, and then planting the semifinished device into the resin. The case potting procedure is performed by filling liquid epoxy resin into a pre-cast case cup and then planting the semifinished device into the resin. Because these two packing procedures commonly use liquid epoxy resin to seal the produce, the production efficiency is low, a high defective rate tends to happen, and environmental pollution problems tend to occur during the packing procedure. Furthermore, if silver-coated conductors are used, it is not necessary to electroplate the finished product. However, the material cost of silver-coated conductors is expensive. If bare copper wires are used, the finished product must be processed through a rotary barrel electric-plating process. After the electric-plating process, the copper wires will be curved and must be corrected by labor. According to DIP method, a lead frame is used, then diodes are welded to the lead frame by re-flow soldering, and then plastic resin is molded on the lead frame and the diodes by casting. This method can produce better quality of silicone bridge rectifiers, however the manufacturing cost of the silicone bridge rectifiers is high because the precision requirements of the lead frame, the molding tool, the lead frame cutting tool as well as the soldering instrument are critical. The cost of a silicone bridge rectifier by DIP method is about 1.5 times over that by WO TYPE PACKAGE. GIC adopted RTV CASTING in 1969 instead of original WO TYPE PACKAGE, and announced DIP bridge in 1970.

SUMMARY OF THE INVENTION

The present invention has been accomplished to provide a semiconductor silicone bridge rectifier fabrication method which eliminates the aforesaid drawbacks. According to one aspect of the present invention, the semiconductor silicone bridge rectifier fabrication method includes the steps of (i). preparing an insulative substrate then processing the substrate with terminal mounting holes and pre-scared grooves, (ii) fastening lead wire terminals or lead-frame terminals to the terminal mounting holes, (iii) fastening diode dice, metal diode disc contacts or small outline axial mounted diodes to the terminals, (iv) molding a plastic molded body on each individual element of the substrate over each set of terminals and diodes, and (v) cutting off the connecting ribs of the terminals, hot dip tinning the terminals, and then separating the substrate through the pre-scaled grooves into individual semiconductor silicone bridge rectifiers for final packing individually. According to another aspect of the present invention, the substrate is prepared from a heat-resisting, insulative board such as a fiber glass reinforced plastic board.

DETAILED DESCRIPTION OF THE PREFERRED EMBODIMENT

Figure 1:
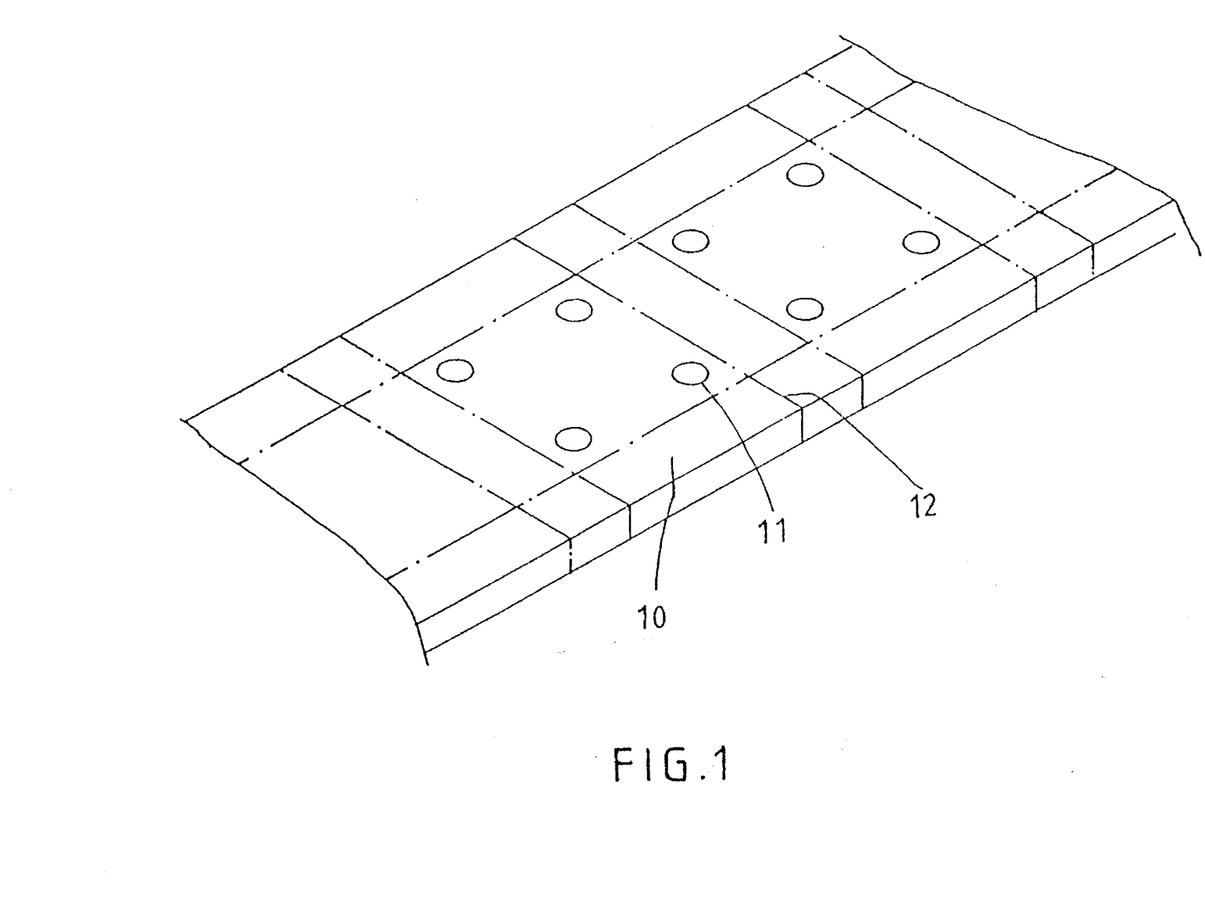
FIG. 1 shows a substrate prepared according to the present invention.
Figure 2:
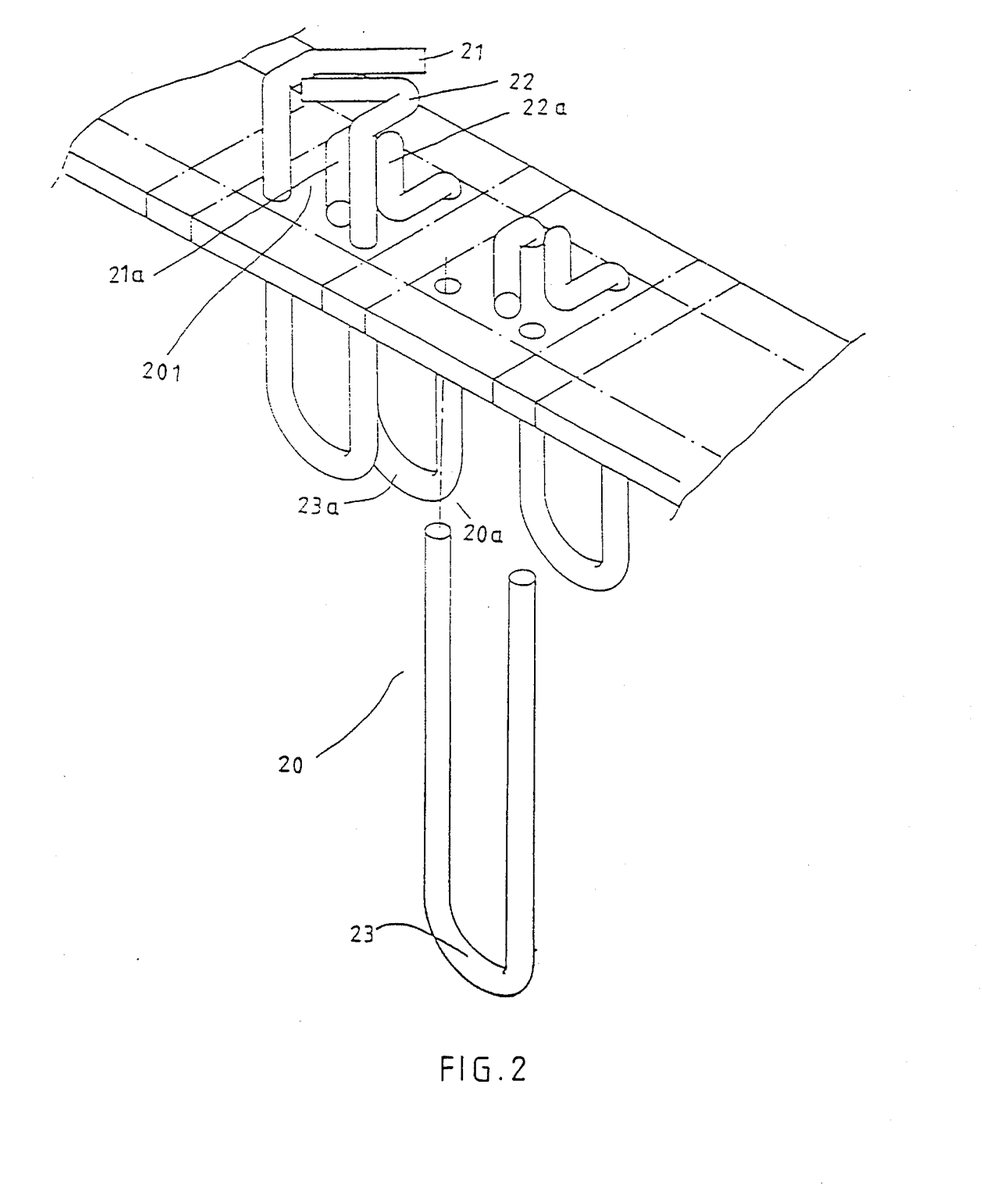
FIG. 2 shows lead wire terminals fastened to the substrate board shown in FIG. 1.
Figure 3:
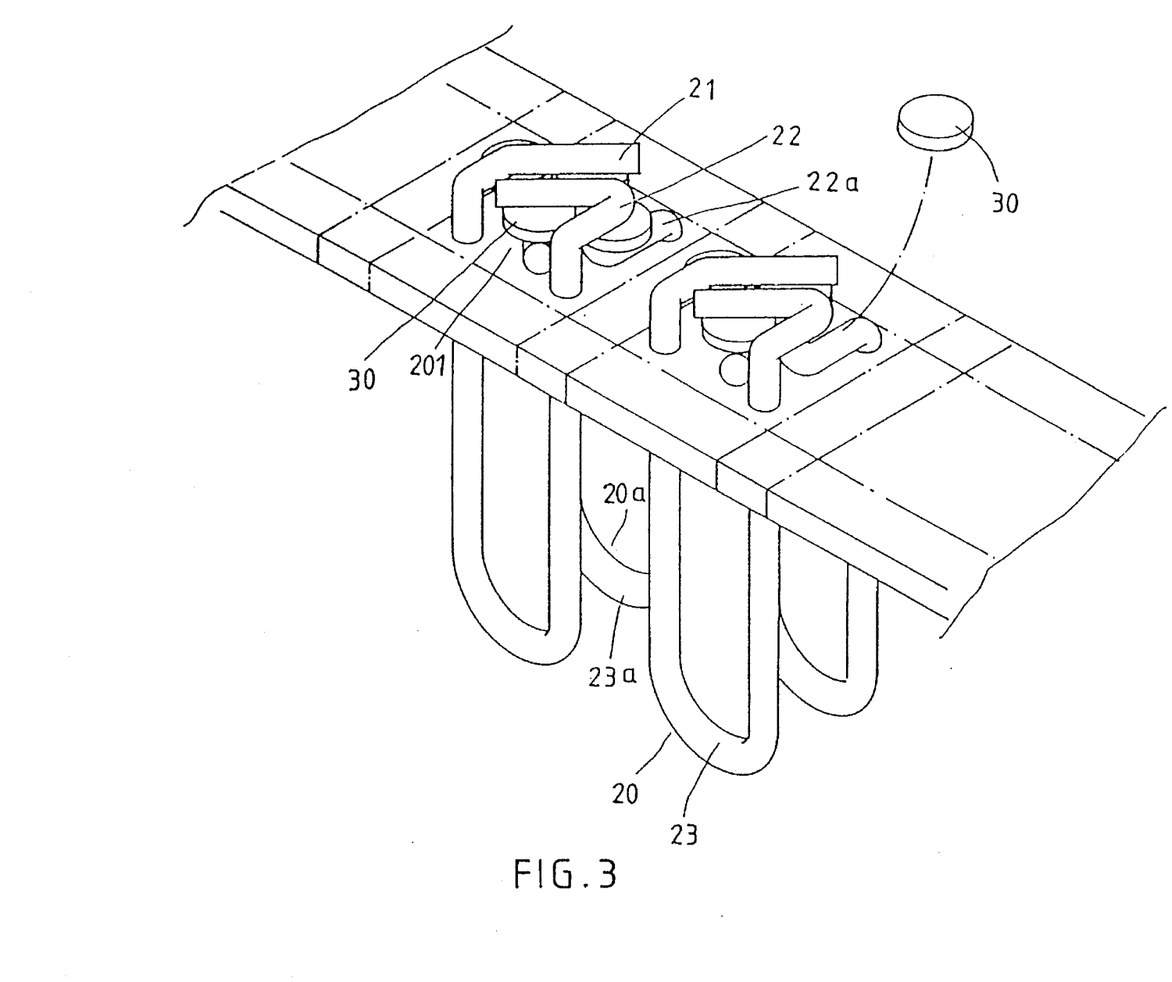
FIG. 3 shows diode dices fastened to the tips of the terminals shown in FIG. 2.
Figure 4:
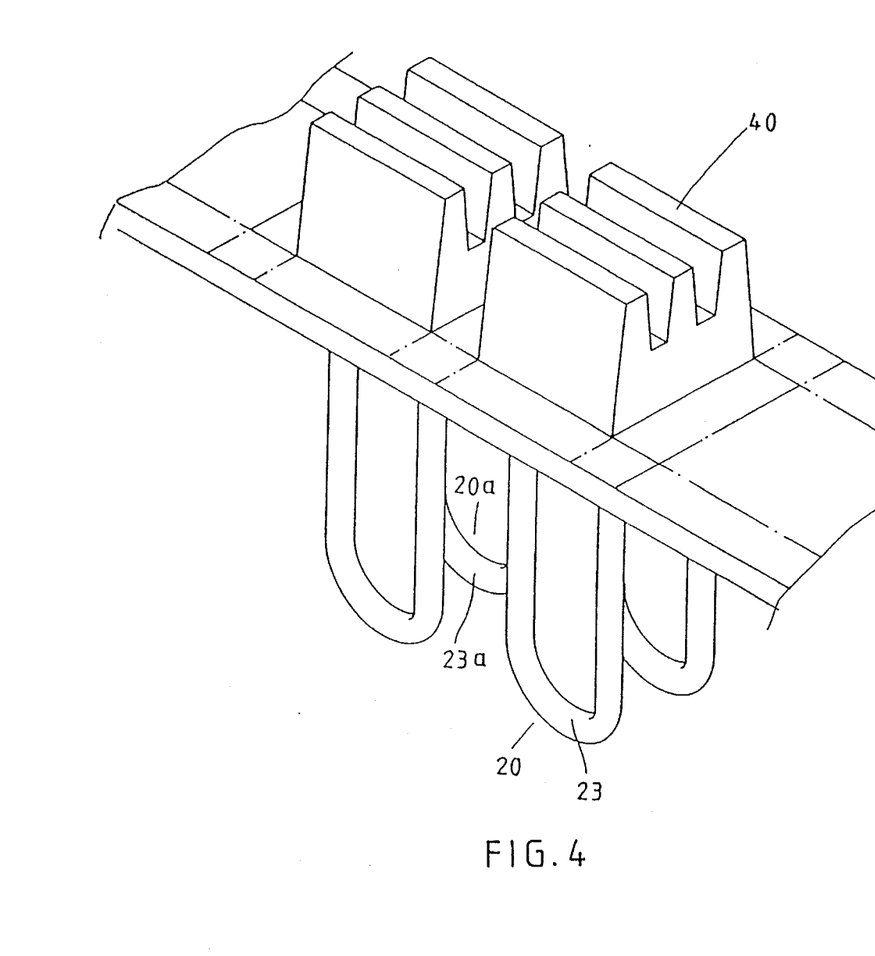
FIG. 4 shows plastic molded bodies respectively molded on the substrate over each individual electric circuit member according to the present invention.
Figure 5:
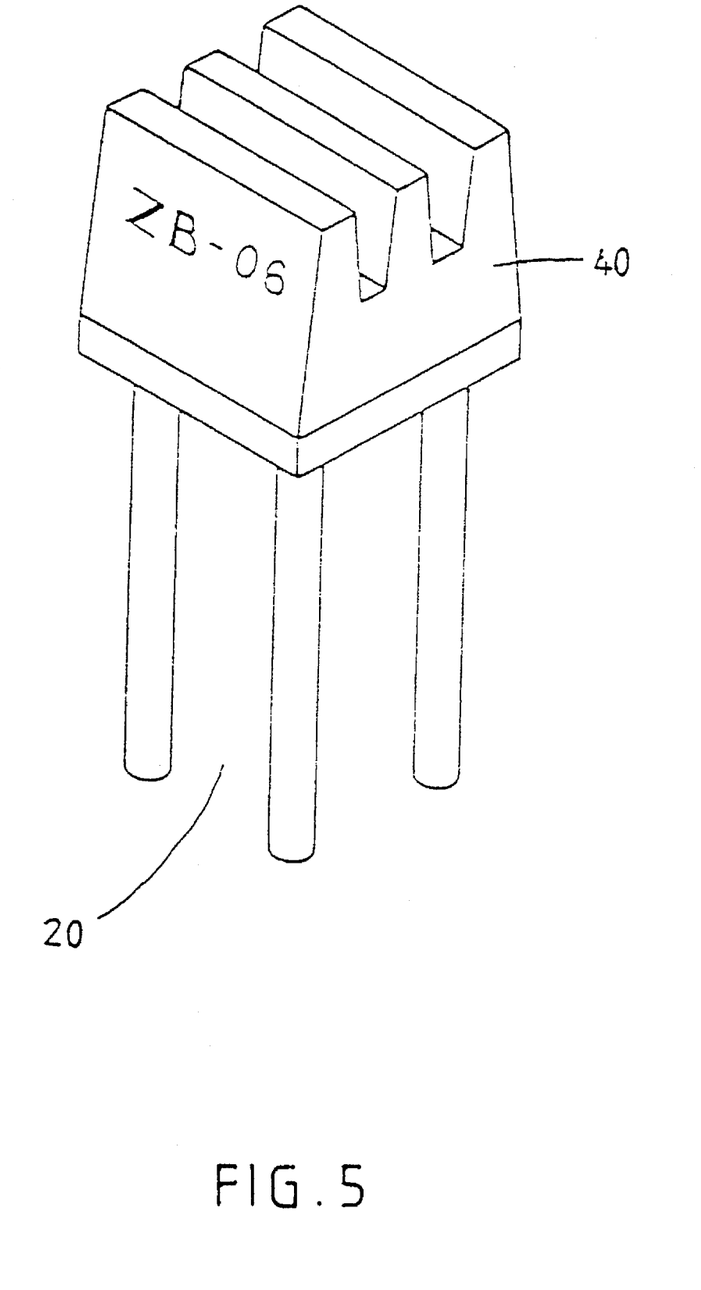
FIG. 5 is an elevational view of a finished semiconductor bridge rectifier according to the present invention.

Referring to FIGS. 1, 2, 3, 4, and 5, a plastic transfer molded semiconductor silicone bridge rectifier with radial terminals in accordance with the present invention is generally comprised of a substrate 10, a plurality of terminals 20 mounted on the substrate 10, a plurality of diode dice 30 respectively mounted between each two adjacent terminals 20 and electrically connected with the terminals 20 into an electric circuit member, and a plastic molded body 40 molded on the substrate 10 over the electric circuit member. The fabrication process of this structure of semiconductor silicone bridge rectifier is outlined hereinafter with reference to FIGS. from 1 to 5, including the steps of:

(i) preparing a substrate 10 from a fiber glass reinforced plastic board, then punching mounting holes 11 through both sides of the substrate 10 and making pre-scared grooves 12 on the substrate 10 for permitting the substrate 10 to be cut into individual elements (see FIG. 1);

(ii) preparing pairs of terminals 20 and 20a, then inserting the opposite tips 21, 22 and 21a, 22a of each pair of terminals 20 and 20a into the mounting holes 11 on each individual element of the substrate 10, and then bending the opposite tips 21, 22 and 21a, 22a of each pair of terminals 20 in such a manner that a retaining space 201 is defined within each pair of terminals 20 and 20a between the opposite tips 21 and 22 of the first terminal 20 and the opposite tips 21a and 22a of the second terminal 20a of the same pair (see FIG. 2);

(iii) inserting pairs of diode dice 30 into each retaining space 201, permitting them to be respectively retained between each pair of terminals 20 and 20a (See FIG. 3);

(iv) welding the diode dice 30 to the tips 21, 22 and 21a, 22a of each pair of terminals 20 and 20a respectively with a lead base solder of melting point about 300° C. by wave soldering by means of selective heating so as to meet the requirements for SMD (surface mounting device) without damaging the substrate 10 (see also FIG. 3);

(v) forcing down the tips 21, 22 and 21a, 22a of each pair of terminals 20 and 20a and the welded diode dice 30 against the top side of the substrate 10, then molding a plastic molded body 40 on each individual element of the substrate 10 over the tips 21, 22 and 21a, 22a of the respective pair of terminals 20 and 20a and the respective diode dice 30 to encapsulate each individual rectifying bridge circuit (see FIG. 4); and (vi) processing the posterior processes including connecting ribs 23 and 23a cutting process, hot dip tinning of the terminals 20 and 20a, electric tests, classifying, labeling, cutting of individual elements of the substrate, and final packing (see also FIG. 5).

Figure 6:
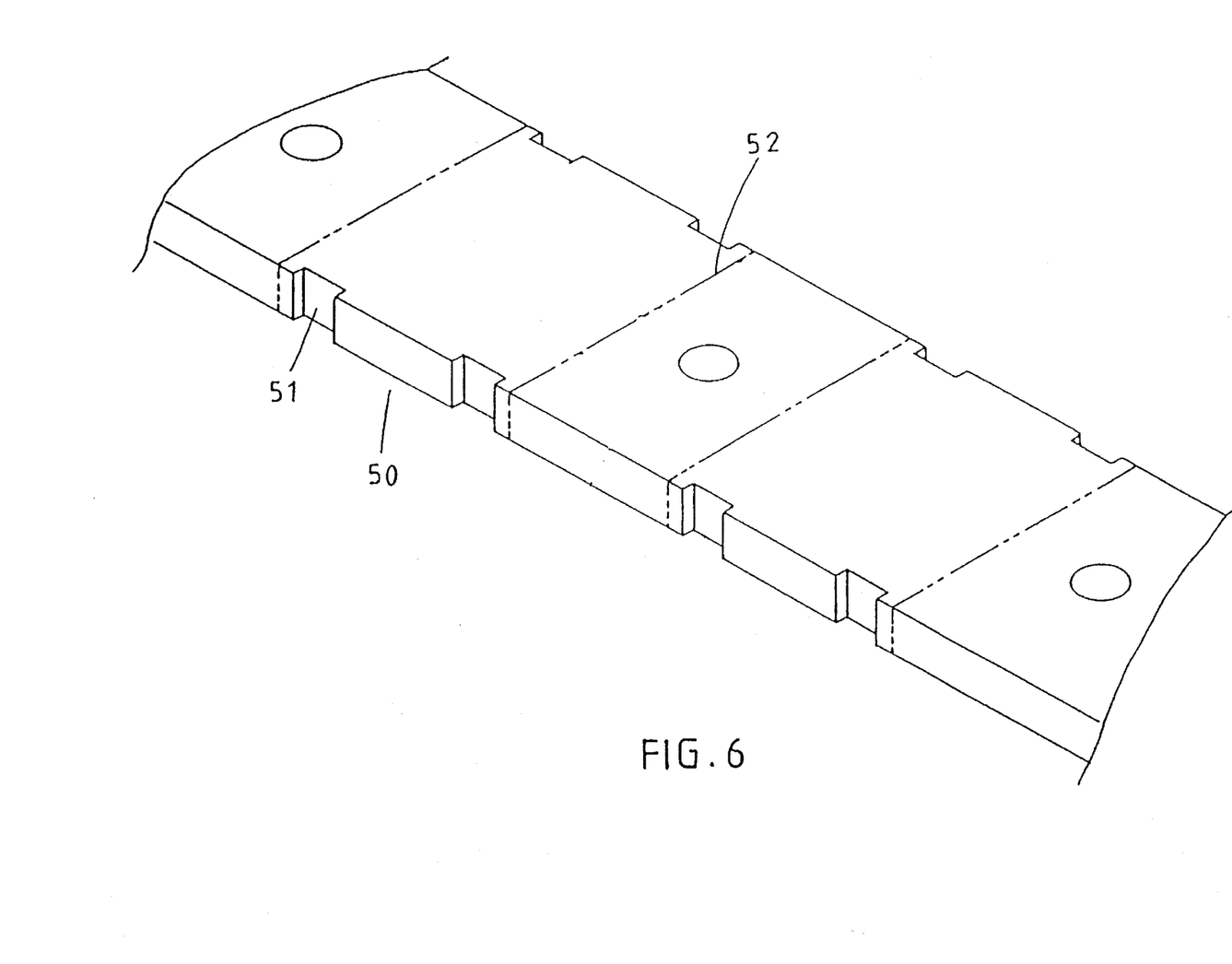
FIG. 6 shows another structure of substrate prepared according to the present invention.
Figure 7:
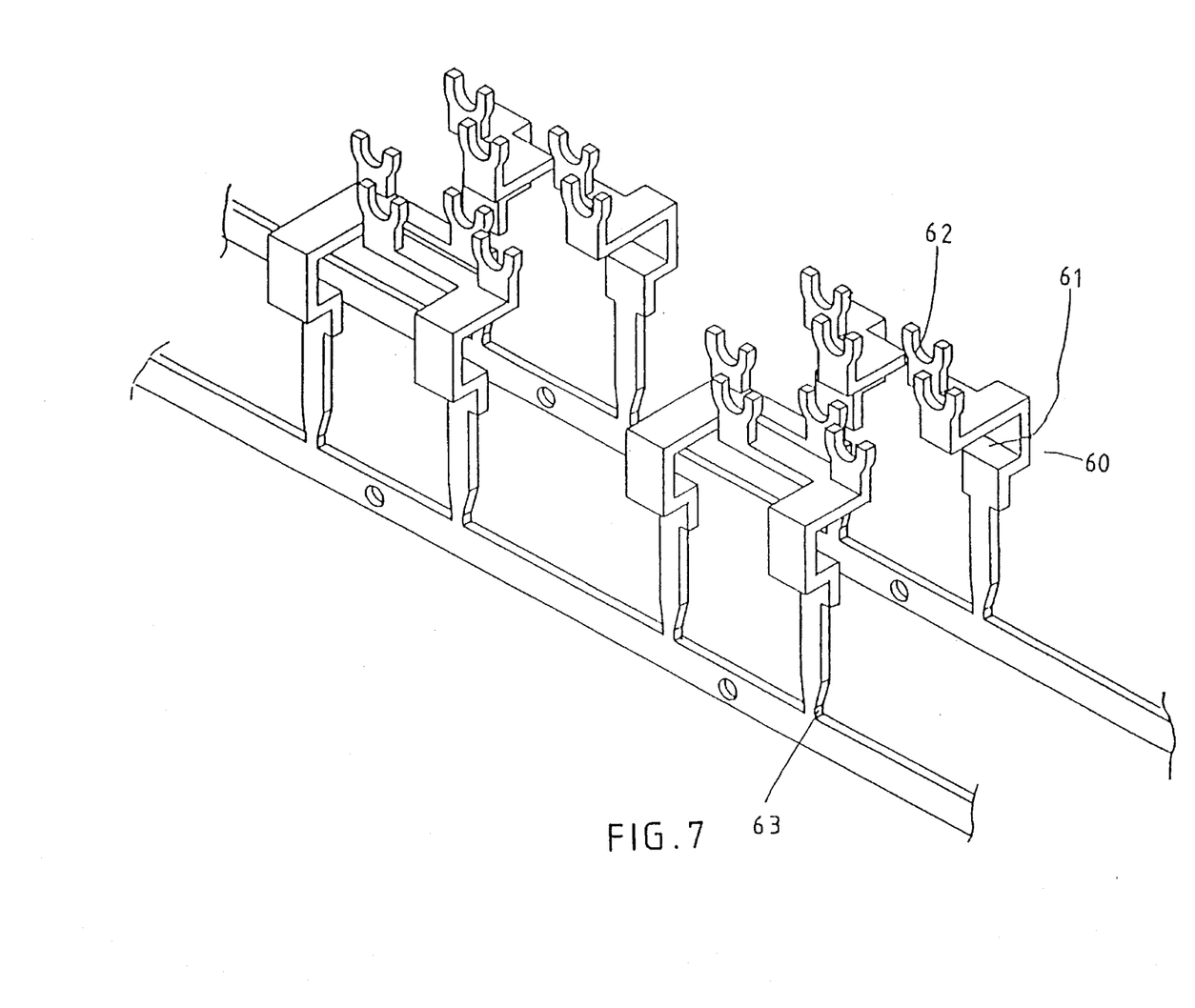
FIG. 7 shows lead frame terminals according to the present invention.
Figure 8:
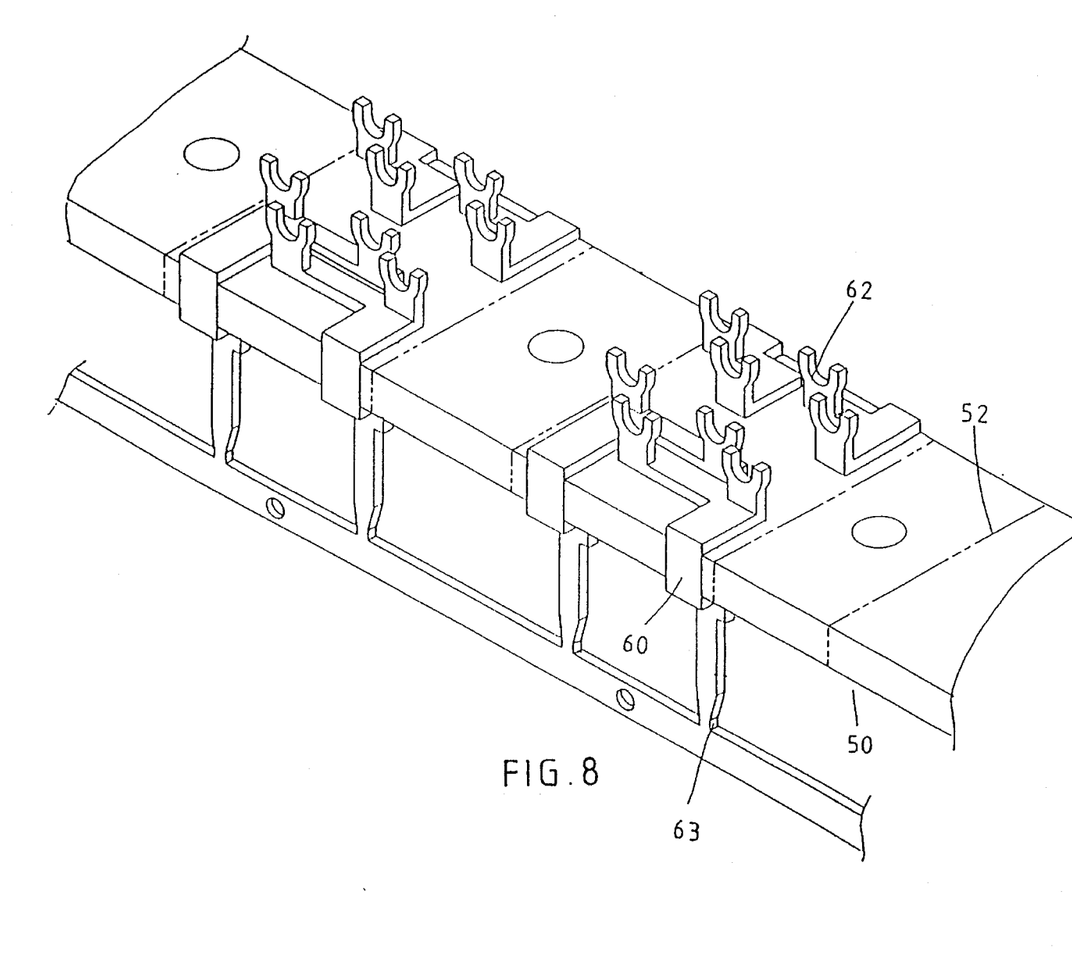
FIG. 8 shows the lead frame terminals of FIG. 7 fastened to the substrate of FIG. 6.
Figure 9:
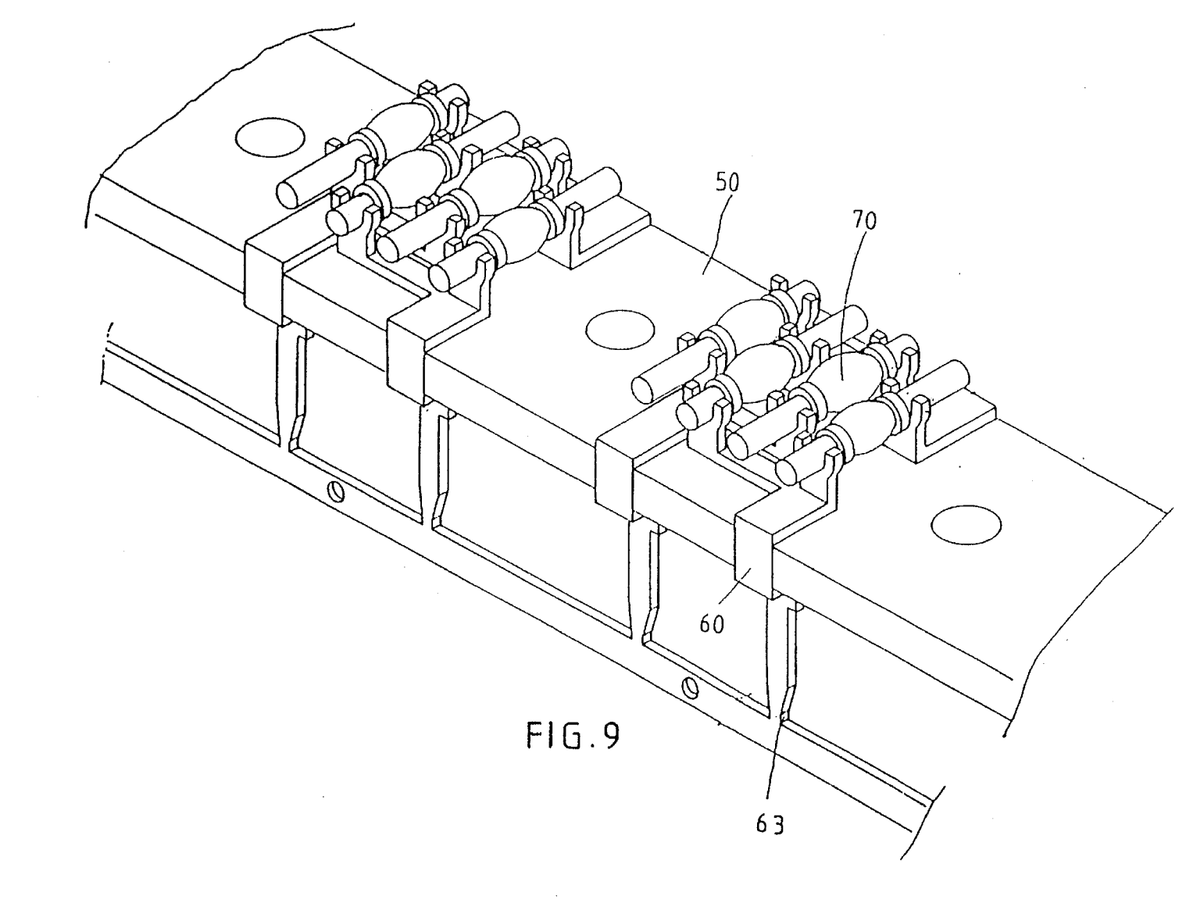
FIG. 9 shows diode conductors fastened to the lead frame terminals of FIG. 8.
Figure 10:
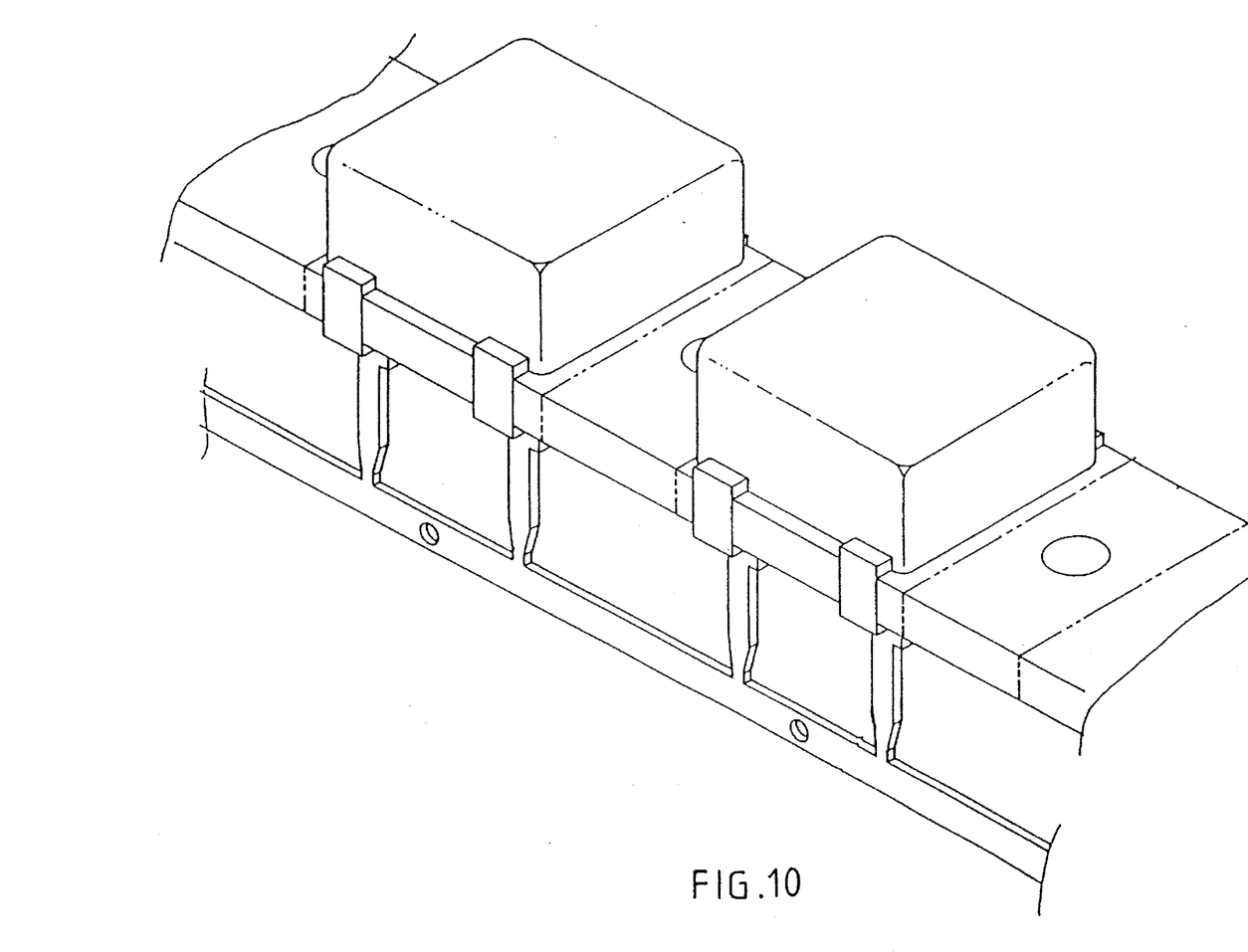
FIG. 10 shows plastic molded bodies respectively molded on the substrate of FIG. 9 over the electric circuit members.
Figure 11:
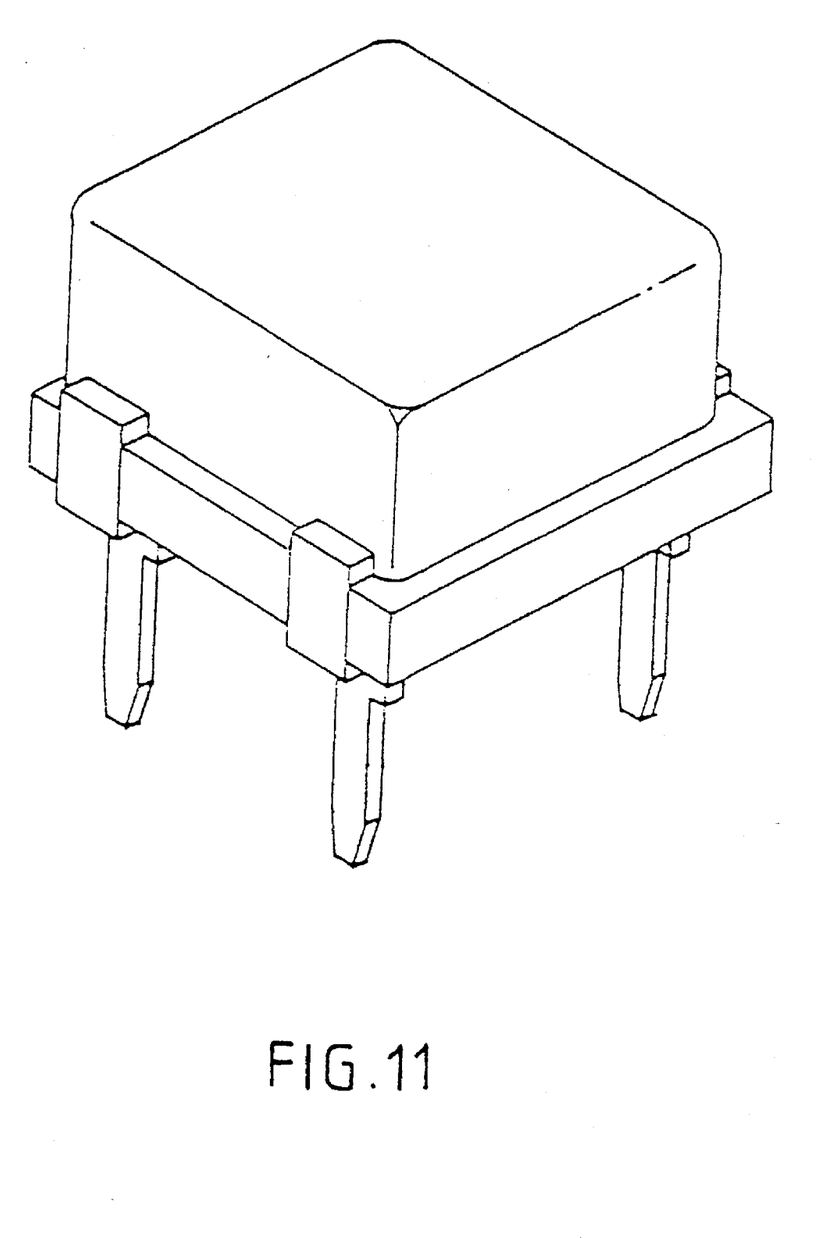
FIG. 11 is an elevational view of an alternate form of the semiconductor silicone bridge rectifier according to the present invention.

FIGS. 6, 7, and 7 show an alternative fabrication process of the plastic transfer molded semiconductor silicone bridge rectifier with radial terminals according to the present invention. This alternative fabrication process includes the steps of:

(i) preparing a substrate 50 from a fiber glass reinforced plastic board, then punching mounting grooves 51 on two opposite lateral sides of the substrate 10 and making pre-scared grooves 12 on the substrate 10 transversely for permitting the substrate 10 to be cut into individual elements (see FIG. 6);

(ii) preparing lead frame terminals 60 (see FIG. 7), then fastening the lead frame terminals 60 to the substrate 50 by attaching the rectangular clamping portions 61 of the lead frame terminals 60 to the mounting grooves 51 (see FIG. 8);

(iii) fastening diode conductors 70 to the notched diode conductor mounting tips 62 of the lead frame terminals 60, and then welding the diode conductors 70 to the tips 62 of the lead frame terminals 60 respectively with a lead base solder of melting point about 300° C. by wave soldering by means of selective heating so as to meet the requirements for SMD (surface mounting device) without damaging the substrate 10 (see FIG. 9);

(iv) molding a plastic molded body 80 on each individual element of the substrate 50 over the respective tips 62 of the lead frame terminals 60 and the respective diode conductors 70 to encapsulate each individual rectifying bridge circuit (see FIG. 10); and (vi) processing the posterior processes including connecting ribs 63 cutting process, hot dip tinning of the terminals 60, electric tests, classifying, labeling, cutting of individual elements of the substrate, and final packing (see also FIG. 11).

The aforesaid two fabrication processes greatly simplifies the fabrication of the semiconductor silicone bridge rectifiers, eliminates the clamping of terminal insert parts, prolongs the service life of the molds. Therefore, the performance of the semiconductor silicone bridge rectifier is greatly improved, and its manufacturing cost is greatly reduced.

The aforesaid semiconductor silicone bridge rectifier is a single wave full cycle rectifying device of which the electric circuit is comprised of four rectifying diodes and conductors electrically connected together. The four terminals which form four electric contacts on the body of the semiconductor silicone bridge rectifier can be arranged in the order of either +, −, AC, AC; or +, AC, −, AC. The type of the terminals can be 1) lead wire type, (2) insertion pin type, or (3) SMD type. The diodes can be (1) diode dice with a respective passivation, (2) metal diode disc contacts, or (3) small outline axial lead mounted diodes.

It is to be understood the the drawings are designed for purposes of illustration only, and are not intended as a definition of the limits and scope of the invention disclosed.

What is claimed is:

1. A method of fabricating plastic transfer molded semiconductor silicone bridge rectifier with radial terminals, comprising a substrate, a plurality of terminals mounted on said substrate, a plurality of diode elements respectively mounted between said terminals and electrically connected with said terminals into an electric circuit member, and plastic molded bodies respectively molded on said substrate over each electric circuit member, and a plastic molded body molded on said substrate over said electric circuit member, wherein said substrate is prepared from a fiber glass reinforced plastic board punched with mounting holes through both sides thereof, and processed with pre-scared grooves through which said substrate is cut into individual semiconductor silicone bridge rectifiers after the installation of said terminals and the molding of said plastic molded bodies.

2. The method of claim 1 wherein said terminals are conductive wires.

3. The method of claim 1 wherein said terminals form an integral lead frame.

4. The method of claim 1 wherein said diode elements are diode dice with a respective passivation.

5. The method of claim 1 wherein said diode elements are metal diode disc contacts.

6. The method of claim 1 wherein said diode elements are small outline axial lead mounted diodes.

7. The method of claim 1 wherein said terminals include four terminals arranged in the order of +, −, AC, AC.

8. The method of claim 1 wherein said terminals include four terminals arranged in the order of +, AC, −, AC.

9. The method of claim 1 wherein said terminals are of lead wire type.

10. The method of claim 1 wherein said terminals are of surface mounting device type.

* * * * *